United States Patent
Hung

(10) Patent No.: US 8,448,046 B2
(45) Date of Patent: May 21, 2013

(54) MEMORY ACCESS METHOD CAPABLE OF REDUCING USAGE RATE OF PROBLEMATIC MEMORY BLOCKS

(75) Inventor: Chi-Hsiang Hung, Taipei (TW)

(73) Assignee: Silicon Motion, Inc., Jhubei, Hsinchu County (TW)

( * ) Notice: Subject to any disclaimer, the term of this patent is extended or adjusted under 35 U.S.C. 154(b) by 1217 days.

(21) Appl. No.: 12/260,139

(22) Filed: Oct. 29, 2008

(65) Prior Publication Data

US 2010/0077132 A1    Mar. 25, 2010

(30) Foreign Application Priority Data

Sep. 25, 2008 (TW) .............................. 97136853 A

(51) Int. Cl.
*G06F 11/00* (2006.01)
(52) U.S. Cl.
USPC .......................................... 714/768; 714/763
(58) Field of Classification Search
USPC .......................................... 714/768, 763–765
See application file for complete search history.

(56) References Cited

U.S. PATENT DOCUMENTS

| | | | | |
|---|---|---|---|---|
| 5,418,752 A * | 5/1995 | Harari et al. | | 365/218 |
| 5,928,370 A * | 7/1999 | Asnaashari | | 714/48 |
| 6,260,156 B1 * | 7/2001 | Garvin et al. | | 714/6.13 |
| 6,381,176 B1 * | 4/2002 | Kim et al. | | 365/185.11 |
| 6,629,191 B1 * | 9/2003 | Katayama et al. | | 711/103 |
| 6,662,334 B1 * | 12/2003 | Stenfort | | 714/769 |
| 6,694,402 B1 * | 2/2004 | Muller | | 711/103 |
| 7,295,479 B2 * | 11/2007 | Yoon et al. | | 365/200 |
| 7,370,258 B2 * | 5/2008 | Iancu et al. | | 714/755 |
| 7,451,264 B2 * | 11/2008 | Yero | | 711/103 |
| 7,460,399 B1 * | 12/2008 | Harari et al. | | 365/185.04 |
| 7,552,272 B2 * | 6/2009 | Gonzalez et al. | | 711/103 |
| 7,743,203 B2 * | 6/2010 | France | | 711/103 |
| 8,276,042 B2 * | 9/2012 | Asnaashari et al. | | 714/763 |

(Continued)

FOREIGN PATENT DOCUMENTS

| | | |
|---|---|---|
| JP | 2004139503 | 5/2004 |
| TW | 200519595 | 6/2005 |
| TW | I244587 | 12/2005 |

OTHER PUBLICATIONS

TW language office action dated Dec. 26, 2011.

(Continued)

*Primary Examiner* — Bryce Bonzo
*Assistant Examiner* — Elmira Mehrmanesh
(74) *Attorney, Agent, or Firm* — McClure, Qualey & Rodack, LLP

(57) ABSTRACT

Methods and devices capable of erasing a flash memory evenly are provided, in which a flash memory comprises a data region with a plurality of data blocks and a spare region with a plurality of spare blocks, and a controller retrieves a corresponding data with a check code from a first data block of the flash memory according to a read command from a host, performs a predetermined check to the corresponding data by the check code, determines whether an error is correctable when a check result of the predetermined check represents that the error has occurred, and increases an erase count of the first data block by a predetermined value when the error is correctable.

18 Claims, 17 Drawing Sheets

U.S. PATENT DOCUMENTS

| | | | |
|---|---|---|---|
| 2001/0002174 A1* | 5/2001 | Harari et al. | 365/185.33 |
| 2004/0186946 A1* | 9/2004 | Lee | 711/103 |
| 2004/0228197 A1* | 11/2004 | Mokhlesi | 365/232 |
| 2005/0120265 A1 | 6/2005 | Pline | |
| 2005/0172207 A1 | 8/2005 | Radke et al. | |
| 2006/0206770 A1* | 9/2006 | Chen et al. | 714/718 |
| 2008/0288814 A1* | 11/2008 | Kitahara | 714/5 |
| 2008/0313505 A1* | 12/2008 | Lee et al. | 714/47 |
| 2009/0077429 A1* | 3/2009 | Yim et al. | 714/54 |

OTHER PUBLICATIONS

English language translation of abstract of TW I244587 (published Dec. 1, 2005).

English language translation of abstract of TW 200519595.

English language translation of abstract of JP 2004139503 (published May 13, 2004).

\* cited by examiner

| $LA_0$ | $B_0$ | 0 |
|---|---|---|
| $LA_1$ | $B_1$ | 0 |
| $LA_2$ | $B_2$ | 0 |
| $LA_3$ | $B_3$ | 0 |
| . . . . | . . . . | . . . . |
| $LA_{K-1}$ | $B_{K-1}$ | 0 |

← 50

| $B_K$ | 0 |
|---|---|
| $B_{K+1}$ | 0 |
| $B_{K+2}$ | 0 |
| $B_{K+3}$ | 0 |
| . . . . | . . . . |
| $B_{N-1}$ | 0 |

MEMORY ACCESS METHOD CAPABLE OF REDUCING USAGE RATE OF PROBLEMATIC MEMORY BLOCKS

CROSS REFERENCE TO RELATED APPLICATIONS

This Application claims priority of Taiwan Patent Application No. 97136853, filed on Sep. 25, 2008, the entirety of which is incorporated by reference herein.

BACKGROUND OF THE INVENTION

1. Field of the Invention

The invention relates to a flash memory, and more particularly, to methods and devices capable of evenly erasing a flash memory.

2. Description of the Related Art

A flash memory is a non-volatile memory that can be electrically erased and reprogrammed. Flash memories are primarily used in memory cards and USB flash drives for general storage and transfer of data between computers and other digital products. Flash memories costs far less than EEPROMs and therefore have become a dominant memory device used. Examples of applications using flash memories include Personal Digital Assistants (PDA) and laptop computers, digital audio players, digital cameras and mobile phones.

A flash memory comprises a large number of blocks, and each block comprises a plurality of pages for storing data. A flash memory is erased by a unit of a block and programmed by a unit of a page. In other words, when data of the flash memory is erased, all pages of a block of the memory must be erased together. When data is written to a flash memory, the data, however, can be written to a specific page of a block of the flash memory. In addition, data can only be written to a page where no data is stored or a page which has been erased.

Further, there is a limit as to the number of times a block of a flash memory can be erased, before operation is negatively effected. The controller of a memory module therefore must count the number of times a block of a flash memory is erased; the process is referred to as an erase count of the block. When a block with an erase count greater than a threshold is programmed with data, the block will not be accurately programmed and errors may occur in reading data from the block. It is very important to use blocks evenly, but conventional access methods cannot effectively achieve evenly using blocks. Thus, a novel method for utilizing blocks in of a flash memory effectively and evenly is therefore required.

BRIEF SUMMARY OF THE INVENTION

Embodiments of an access method for a flash memory are provided, in which the flash memory comprises a data region and a spare region, the data region comprises a plurality of data blocks and the spare region comprises a plurality of spare blocks. In the access method, a corresponding data with a check code is retrieved from a first data block of the flash memory according to a read command from a host, a predetermined check is performed to the corresponding data by the check code, whether an error is correctable is determined when a check result of the predetermined check represents that the error has occurred, and an erase count of the first data block is increased by a predetermined value when the error is correctable.

The invention also provides another embodiment of an access method for a flash memory, in which the flash memory is divided into a data region with a plurality of data blocks and a spare region with a plurality of spare blocks. In the access method, a corresponding data with a check code is retrieved from a first data block of the flash memory according to a read command from a host, a predetermined check is performed to the corresponding data by the check code, whether an error is correctable is determined when a check result of the predetermined check represents that the error has occurred, and an erase count of the first data block is increased by a predetermined value when the error is correctable. Data corresponding to a logical address linked to a second data block of the data region is received when receiving a write command from the host, a first spare block is popped from the spare region, and data stored in a third data block is written to the first spare block and the third data block and the first spare block are re-mapped when an erase count of the first spare block reaches a default value and the data region has the third data block with an erase count of zero.

The invention also provides an embodiment of a memory device, in which a flash memory comprises a data region with a plurality of data blocks and a spare region with a plurality of spare blocks, and a controller retrieves a corresponding data with a check code from a first data block of the flash memory according to a read command from a host, performs a predetermined check to the corresponding data by the check code, determines whether an error is correctable when a check result of the predetermined check represents that the error has occurred, and increases an erase count of the first data block by a predetermined value when the error is correctable.

BRIEF DESCRIPTION OF THE DRAWINGS

The invention can be more fully understood by reading the subsequent detailed description and examples with references made to the accompanying drawings, wherein:

FIG. 2 shows mapping tables of data blocks and the spare blocks according to the invention;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Certain terms are used throughout the description and claims to refer to particular system components. As one skilled in the art will appreciate, consumer electronic equipment manufacturers may refer to a component by different names. This document does not intend to distinguish between components that differ in name but not function.

Figure 1:
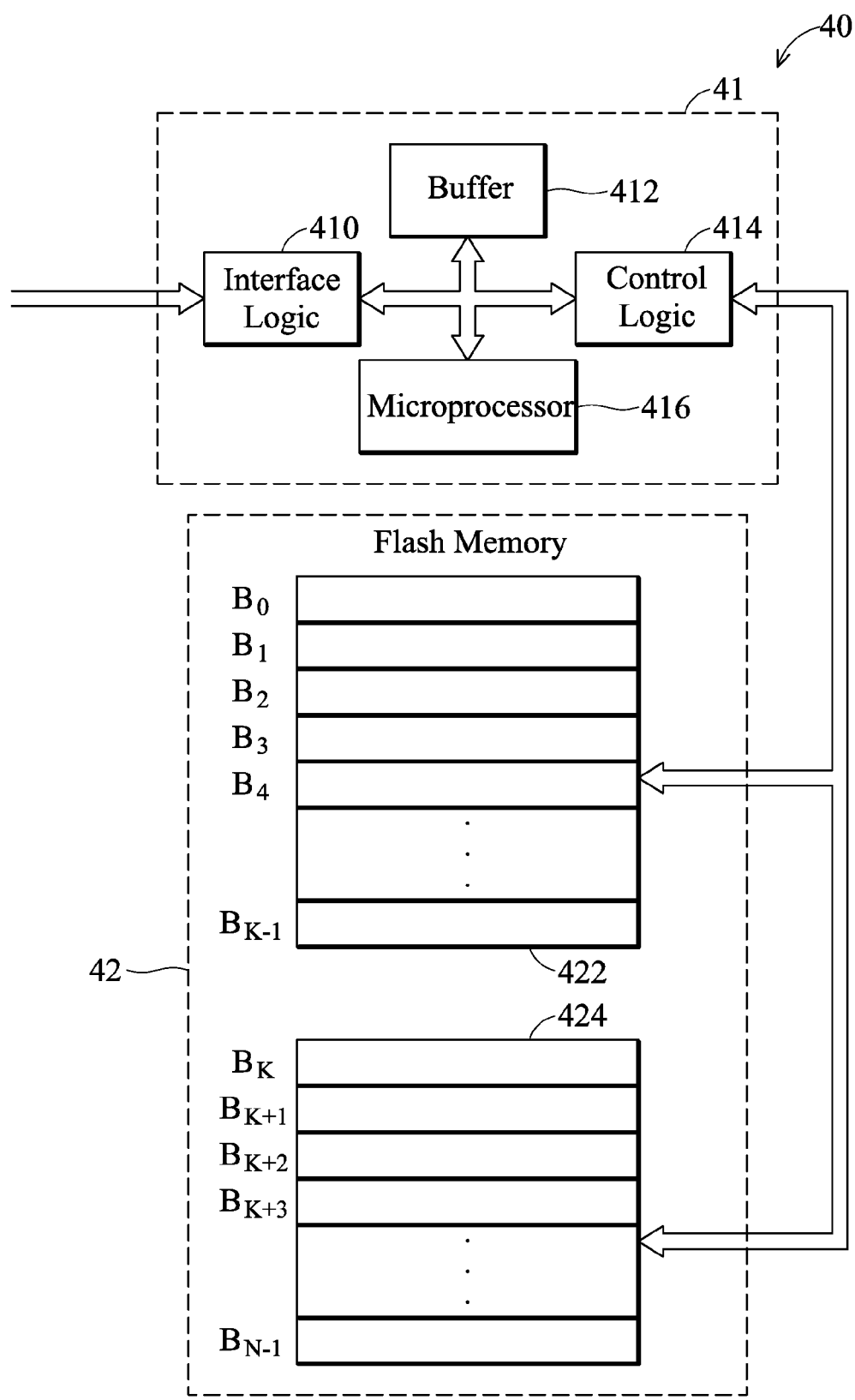
FIG. 1 shows a diagram of an embodiment of a memory device according to the invention.

FIG. 1 shows a diagram of an embodiment of a memory device according to the invention. As shown, the memory device 40 comprises a memory controller 41 and a non-volatile flash memory 42. The memory controller 41 comprises interface logic 410, a volatile buffer 412, control logic 414 and a microprocessor 416. The interface logic 410 communicates with a host (not shown), and the buffer 412 temporarily stores data written into the flash memory 42 or data retrieved from the flash memory 42. The interface logic 410, the buffer 412, the control logic 414 and the microprocessor 416 are coupled to each other, and the interface logic 410, the buffer 412 and the control logic 414 are controlled by the microprocessor 416. For example, the buffer 412 can be a random access memory (RAM), but is not limited thereto. The flash memory 42 is divided into a data region 422 and a spare region 424. For example, the data region 422 comprises K data blocks $B_0 \sim B_{K-1}$ which have been stored data therein, and the spare region 424 comprises (N-K) spare blocks $B_K \sim B_{N-1}$. New data can be written into the spare blocks $B_K \sim B_{N-1}$ directly, but the data blocks $B_0 \sim B_{K-1}$ can only be written over again after being erased.

FIG. 2 shows mapping tables of data blocks and the spare blocks according to the invention. As shown, the data block mapping table 50 shows the relationship between logic addresses $LA_0 \sim LA_{K-1}$ and records erase counts of the data blocks $B_0 \sim B_{K-1}$, and the spare block mapping table 52 records the spare blocks $B_K \sim B_{N-1}$ and erase counts of the spare blocks $B_K \sim B_{N-1}$. Initially, the logical address $LA_0$ is linked to a physical address of the block $B_0$, the logical address $LA_1$ is linked to a physical address of the block $B_1$, the logical address $LA_2$ is linked to a physical address of the block $B_2$, and so on. On the contrary, physical addresses of the spare blocks are not linked to the logic addresses. In addition, erase counts of the blocks are initially, zero.

Figure 3:
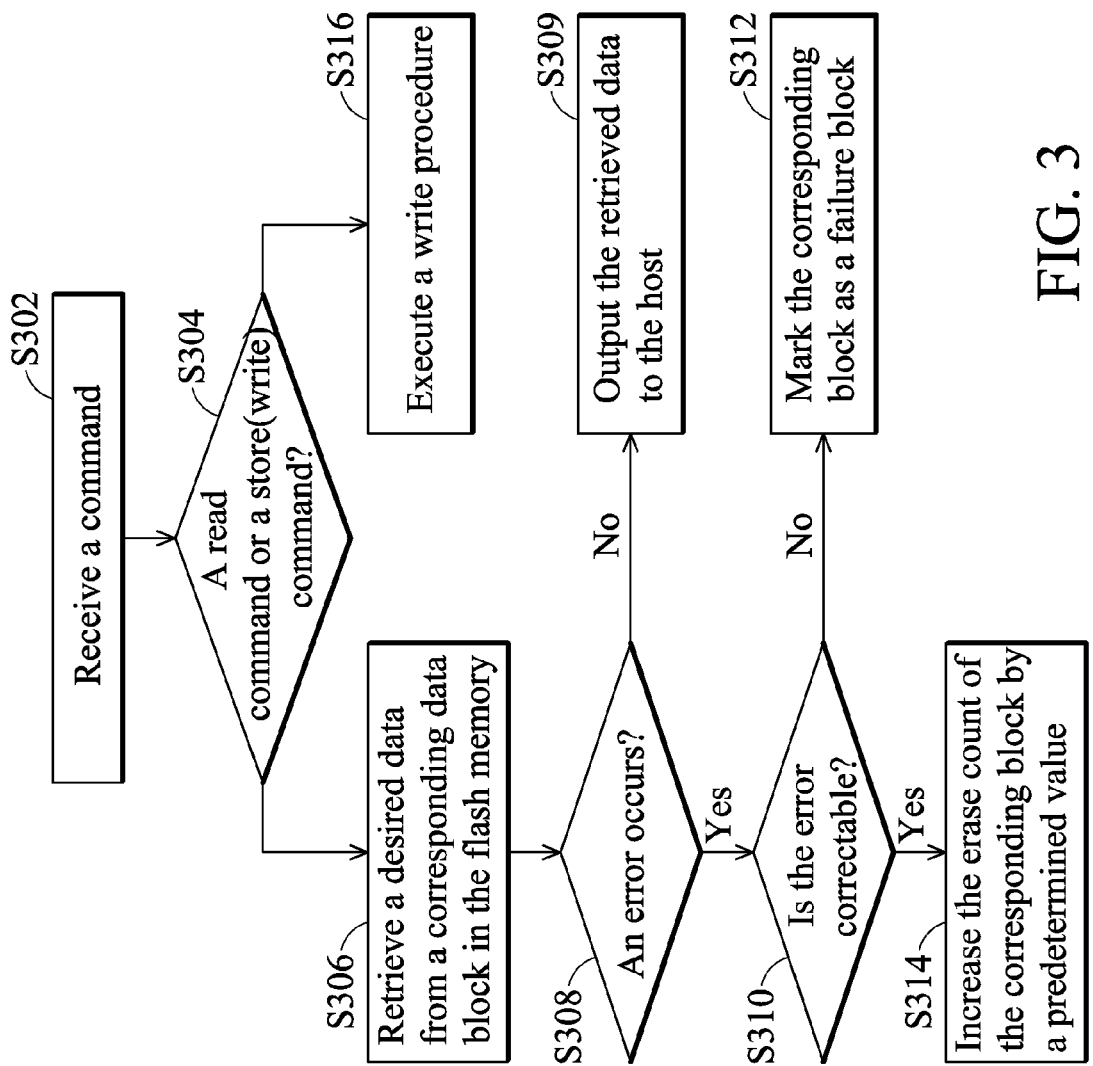
FIG. 3 is a flowchart of an access method for a flash memory according to the invention.

FIG. 3 is a flowchart of an access method for a flash memory according to the invention. The access method will be discussed hereafter. First, in step S302, the memory controller 41 receives a command from a host (not shown). In step S304, the memory controller 41 determines that the received command is a read command or a write (store) command. Step S306 is then executed when the received command is a read command. On the contrary, step S316 is executed when the received command is a write command. In step S306, the memory controller 41 retrieves desired data from a corresponding data block in the flash memory 42 according to the received command, because the received command is a read command. For example, the retrieved data comprise a predetermined check code, such as error check code (ECC). Next, in step S308, the memory controller 41 performs a predetermined check, such as an error correction check code (ECC) check, to the retrieved data, and determines whether an error has occurred according to the result of the predetermined check. Step S309 is then executed when no error has occurred, such that the memory controller 41 directly outputs the retrieved data to the host. On the contrary, step S310 is executed when the result of the predetermined check represents that an error has occurred.

In step S310, the memory controller 41 determines whether the error is correctable. Step S312 is then executed when the error is uncorrectable. On the contrary, step S312 is executed when the error is correctable. In step S312, the memory controller 41 marks the corresponding data block as a failed block because the error cannot be corrected. In step S314, the memory controller 41 increases the erase count of the corresponding data block by a predetermined value because the error is correctable, thereby decreasing utility rate of the corresponding data block. Typically, the predetermined value exceeds two. For example, the predetermined value can be 10, 20, 50, 100, 150 or 240, but is not limited thereto. In addition, the memory controller 41 also outputs the retrieved and corrected data to the host. In step S316, because the received command is a write command, the memory controller 41 executes a write procedure to write new data from the host into the flash memory 42. The write procedure will be discussed hereafter.

Figure 4:
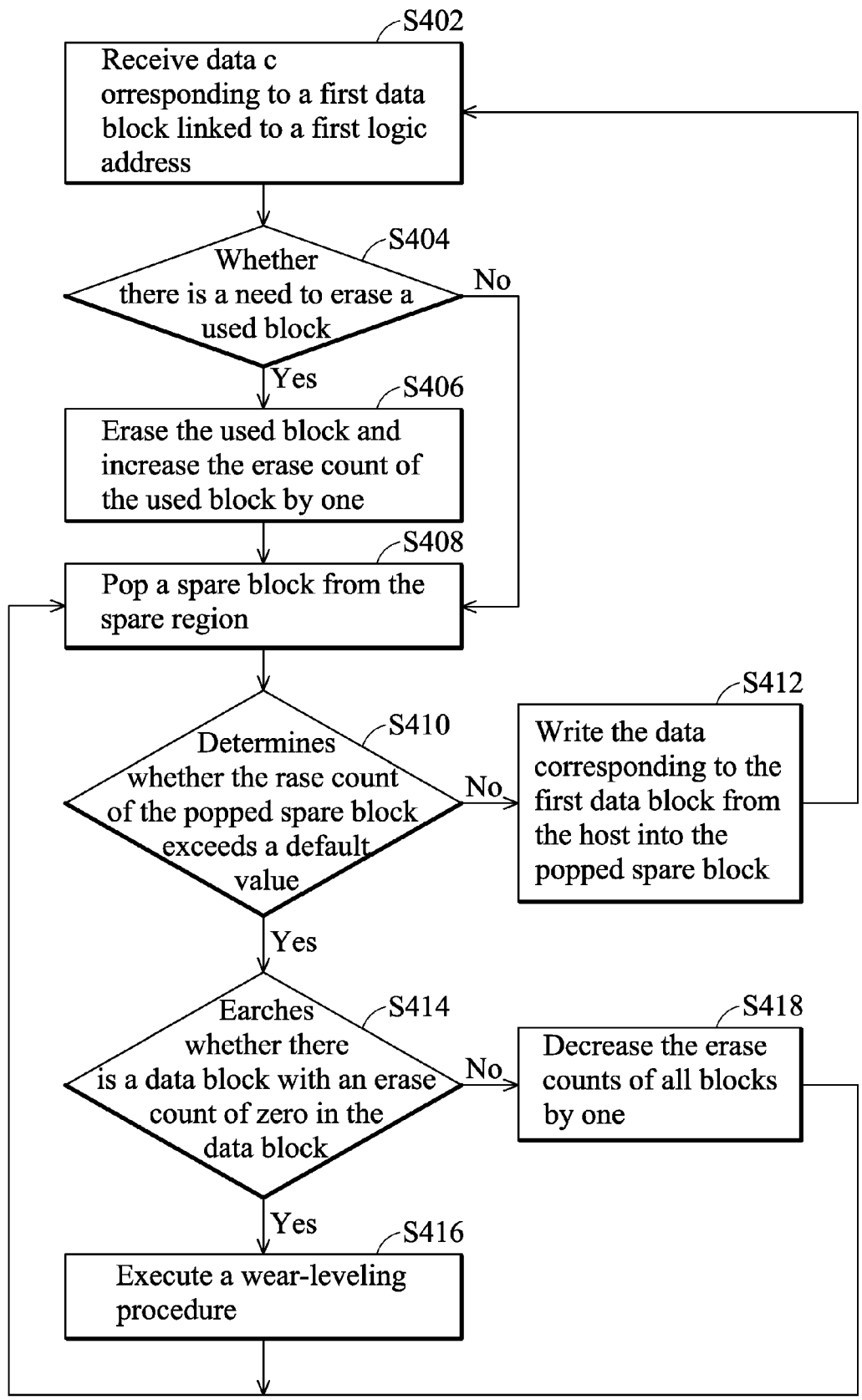
FIG. 4 is a flowchart illustrating the write procedure in the FIG. 3.

FIG. 4 is a flowchart illustrating the write procedure in the FIG. 3. In step S402, the memory controller 41 receives data corresponding to a first data block linked to a first logic address, and temporarily stores the data into the buffer 42. Then, in step S404, the memory controller 41 determines whether there is a need to erase a used block. Step S406 is executed if there is a need to erase a used block, otherwise, step S408 is executed. Typically, the data region 422 has file allocation table (FAT) blocks, mother blocks and child blocks, which means that there is a need to erase the used block(s) when match number of the FAT blocks, the mother blocks or the child blocks is full. In step S406, the memory controller 41 erases the used block(s), increases the erase count(s) of the used block(s) by one, and pushes the erased block(s) into the bottom of a queue of the spare region 424 as a part of the spare region 424 (i.e., the memory controller 41 recycles the erased block(s)). Namely, the memory controller 41 performs data integration to the data blocks of the data region 422 before step S408.

In step S408, the memory controller 41 pops a spare block from the spare region 424. For example, the memory controller 41 pops a spare block at the top of the queue of the spare region 424. Then, in step S410, the memory controller 41 determines whether the erase count of the popped spare block reaches a default value. For example, the default value can be 400, but is not limited thereto. Step S412 is executed then when the erase count of the popped spare block is less than the default value. On the contrary, step S414 is executed when the erase count of the popped spare block reaches the default value.

In step S412, the memory controller 41 writes the data corresponding to the first data block from the host into the popped spare block. Next, the memory controller 41 erases the first data block and pushes the erased first data block into the bottom of the queue as a part of the spare region 424. In addition, the memory controller 41 re-maps the physical address of the popped spare block, and the procedure returns to step S402. For example, the memory controller 41 links the physical address of the popped spare block to the first logical address.

In step S414, when the erase count of the popped spare block reaches the default value (for example 400), the memory controller 41 searches whether there is a second data block with an erase count of zero in the data region 422. Step S416 is then executed when the memory controller 41 locates a second data block with an erase count of zero in the data region 422. On the contrary, step S418 is executed when there is no data block with an erase count of zero in the data region 422. In step S416, the memory controller 41 executes a wear-leveling procedure. For example, the memory controller 41 writes data stored in the second data block into the popped spare block, erases the second data block and pushes the erased second data block into the bottom of the queue as a part of the spare region 424. The procedure returns to the step S408 after the step S416 for processing the data corresponding to the first data block linked to the first logical address. When the erase count of the next spare block is less than 400, step S412 is executed to write the data corresponding to the first data block linked to the first logical address into the spare block.

In step S418, the memory controller 41 records the physical address(es) of the spare block(s) which has/have an erase count exceeding the default value (400) into the buffer 412 and decreases the erase counts of all data blocks and all spare blocks by one, and the procedure returns to step S408 for processing the data corresponding to the first data block linked to the first logical address. It is assumed that the erase count of the next spare block, such as a second spare block, is less than 400, so step S412 is executed to write the data corresponding to the first data block linked to the first logical address into the second spare block. After the data corresponding the first data block linked to the first logical address is written into to the second spare block, the memory controller 41 searches whether there is a data block with an erase count of zero in the data region 422 again. If there is a data block with an erase count of zero in the data region 422, the memory controller 41 writes data stored in the data block with an erase count of zero into the popped spare block with an erase count which reaches the default value. Then, the memory controller 41 erases the data block with an erase count of zero and pushes the erased data block into the bottom of the queue as a part of the spare region 424.

If there is still no data block with an erase count of zero in the data region 422, the memory controller 41 decreases the erase counts of the all data blocks and all spare blocks by one again and searches whether there is a data block with an erase count of zero in the data region 422 after the next data has been written, until one of the data blocks has an erase count of zero. At this time, the memory controller 41 selects/pops the data block with an erase count of zero, links the logical address corresponding to the data block to the spare block with an erase count which reaches the default value, and pushes the data block into the bottom of the queue as a part of the spare region 424. For example, the memory controller 41 searches whether there is a data block with an erase count of zero in the data region 422 again after step S412 is executed. If there is a data block with an erase count of zero in the data region 422, the memory controller 41 selects the data block with an erase count of zero, links the logical address corresponding to the data block to the popped spare block with an erase count which reaches the default value, then, the memory controller 41 pushes the data block into the bottom of the queue as a part of the spare region 424, and the procedure returns to step S402. On the contrary, if there is still no data block with an erase count of zero, the procedure directly returns to step S402.

In some embodiments, when there is no data block with an erase count of zero in the data region 422, the memory controller 41, following each determination, decreases erase counts of the all data blocks and all spare blocks by one until one of the data blocks has an erase count of zero, and selects/pops the data block with an erase count of zero, and then the procedure returns to step S416.

Figure 5A:
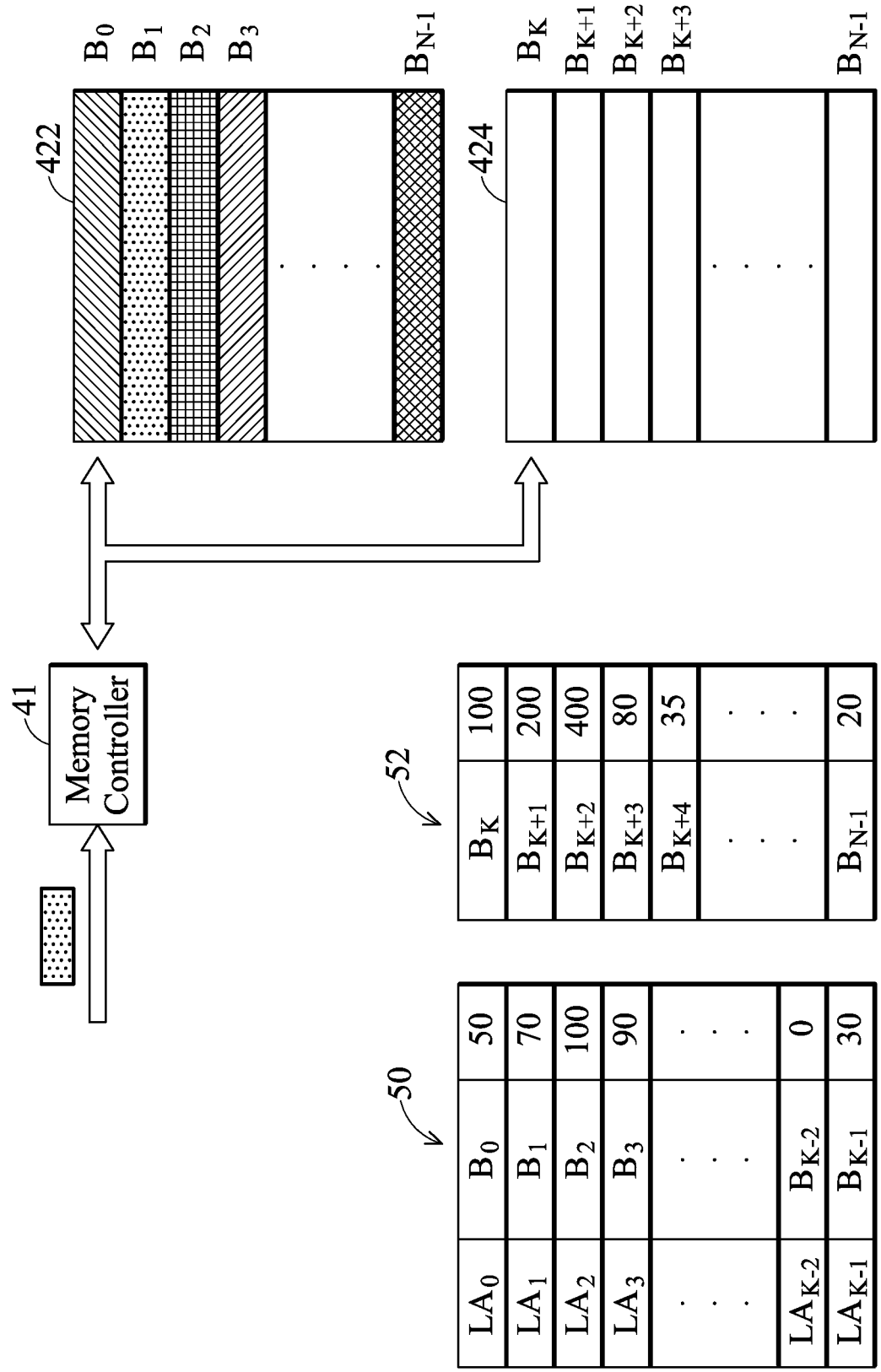
FIGS. 5A~5E are access diagrams illustrating the write procedure according to the flash memory of the invention.

FIGS. 5A~5D are access diagrams illustrating the previously mentioned write procedure according to the flash memory of the invention. As shown in FIG. 5A, each data block in the data region 422 stores data, and each spare block in the spare region 424 are empty (i.e. stores no data). In addition, the logical address $LA_0$ is linked to the data block $B_0$ with an erase count of 50, the logical address $LA_1$ is linked to the data block $B_1$ with an erase count of 70, the logical address $LA_2$ is linked to the data block $B_2$ with an erase count of 100, and so on. Also, the spare region mapping table 52 shows that the erase count of the spare block $B_K$ is 100, the erase count of the spare block $B_{K+1}$ is 200, the erase count of the spare block $B_{K+2}$ is 400, and so on.

After receiving the write command, the memory controller 41 receives data corresponding to the data block $B_1$ linked to the logical address $LA_1$ from the host, and temporarily stores the received data into the buffer 412. Afterwards, the memory controller 41 determines whether there is a need to erase a used block. If there is a need to erase a used block, the memory controller 41 erases the used block, increases the erase count of the used block, and pushes the erased block into the bottom of the queue as a part of the spare region 424. It should be noted that the above determination, erase and pushing steps are optional, and can be omitted in some embodiments.

Figure 5B:
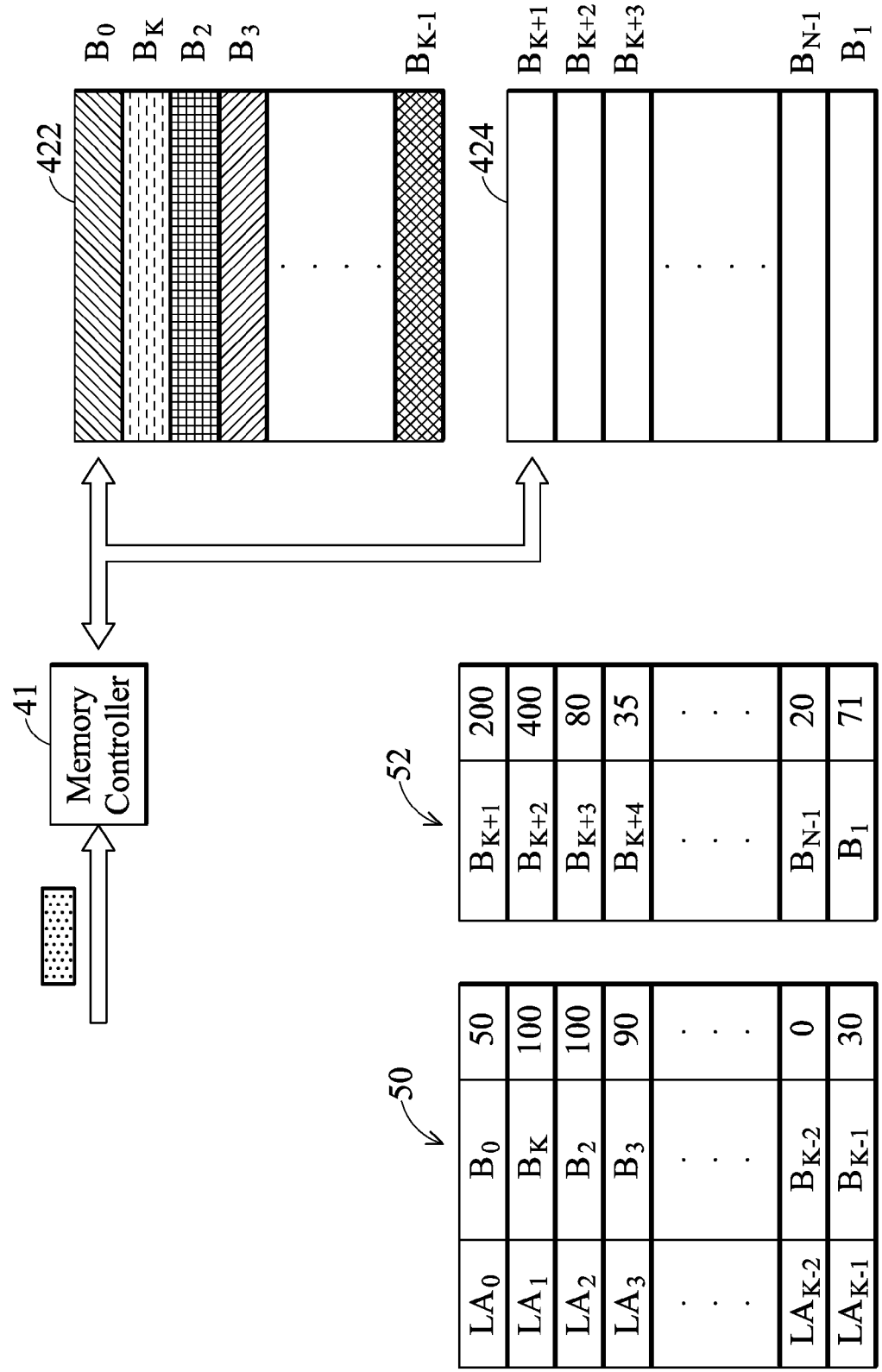

Then, the memory controller 41 pops the spare block $B_K$ at the top of the queue of the spare region 424 and determines whether the erase count of the spare block $B_K$ reaches the default value (i.e., 400). Because the erase count of the spare block $B_K$ is 100 and is less than the default value, the memory controller 41 re-maps the data block $B_1$ and the spare block $B_K$. Namely, the memory controller 41 writes the data corresponding to the data block $B_1$ from the host into the spare block $B_K$ and links the logical address $LA_1$ to the physical address of the spare block $B_K$. Then, the memory controller 41 erases the data block $B_1$ and pushes the erased data block $B_1$ into the bottom of the queue as a part of the spare region 424. As shown in FIG. 5B, the block $B_K$ is recorded in the data region 422, and the block $B_1$ is recorded in the spare region 424. It should be noted that the erase count of the block $B_1$ is 71 and is recorded in the spare block mapping table 52.

Afterwards, if data corresponding to the data block $B_2$ linked to the logical address $LA_2$ from the host is received, the memory controller 41 temporarily stores the received data into the buffer 412. Then, the memory controller 41 determines whether there is a need to erase a used block. If there is a need to erase a used block, the memory controller 41 erases the used block, increases the erase count of the used block, and pushes the erased block into the bottom of the queue as a part of the spare region 424. It should be noted that the above determination, erase and pushing steps are optional, and can be omitted in some embodiments.

Figure 5C:
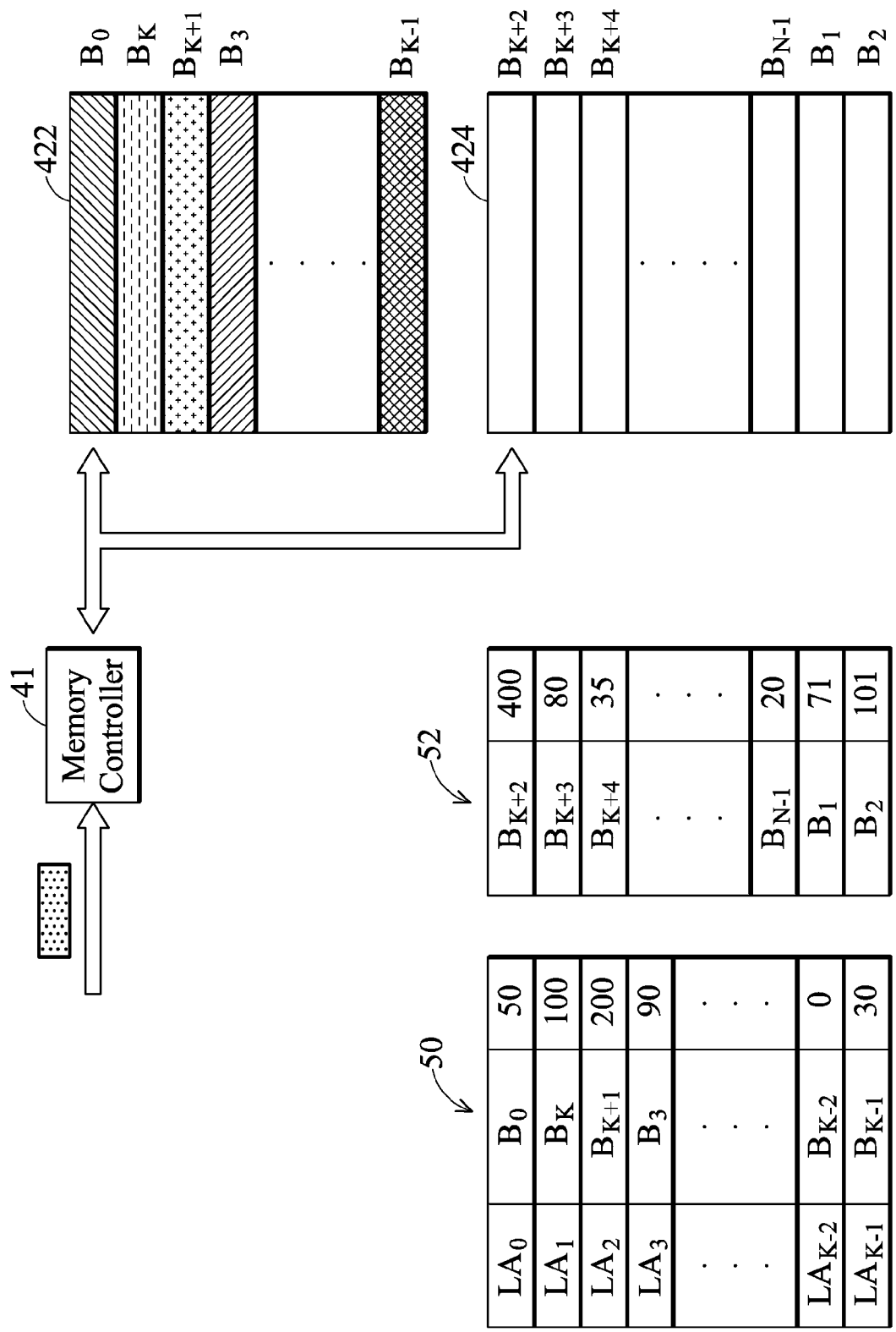

Next, the memory controller 41 pops the spare block $B_{K+1}$ at the top of the queue of the spare region 424 and determines whether the erase count of the spare block $B_{K+1}$ reaches 400. Because the erase count of the spare block $B_{K+1}$ is 200 and is less than 400, the memory controller 41 re-maps the data block $B_2$ and the spare block $B_{K+1}$. Namely, the memory controller 41 writes the data corresponding to the data block $B_2$ from the host into the spare block $B_{K+1}$ and links the logical address $LA_2$ to the physical address of the spare block $B_{K+1}$, erases the data block $B_2$ and pushes the erased data block $B_2$ into the bottom of the queue as a part of the spare region 424. As shown in FIG. 5C, the block $B_{K+1}$ is recorded in the data region 422, and the block $B_2$ is recorded in the spare region 424. It should be noted that the erase count of the block $B_2$ is 101 and is recorded in the spare block mapping table 52.

Subsequently, if data corresponding to the data block $B_3$ linked to the logical address $LA_3$ from the host is received, the memory controller 41 temporarily stores the received data into the buffer 412. Then, the memory controller 41 determines whether there is a need to erase a used block. If there is a need to erase a used block, the memory controller 41 erases the used block, increases the erase count of the used block, and pushes the erased block into the bottom of the queue as a part of the spare region 424. It should be noted that the above determination, erase and pushing steps are optional, and can be omitted in some embodiments.

Figure 5D:
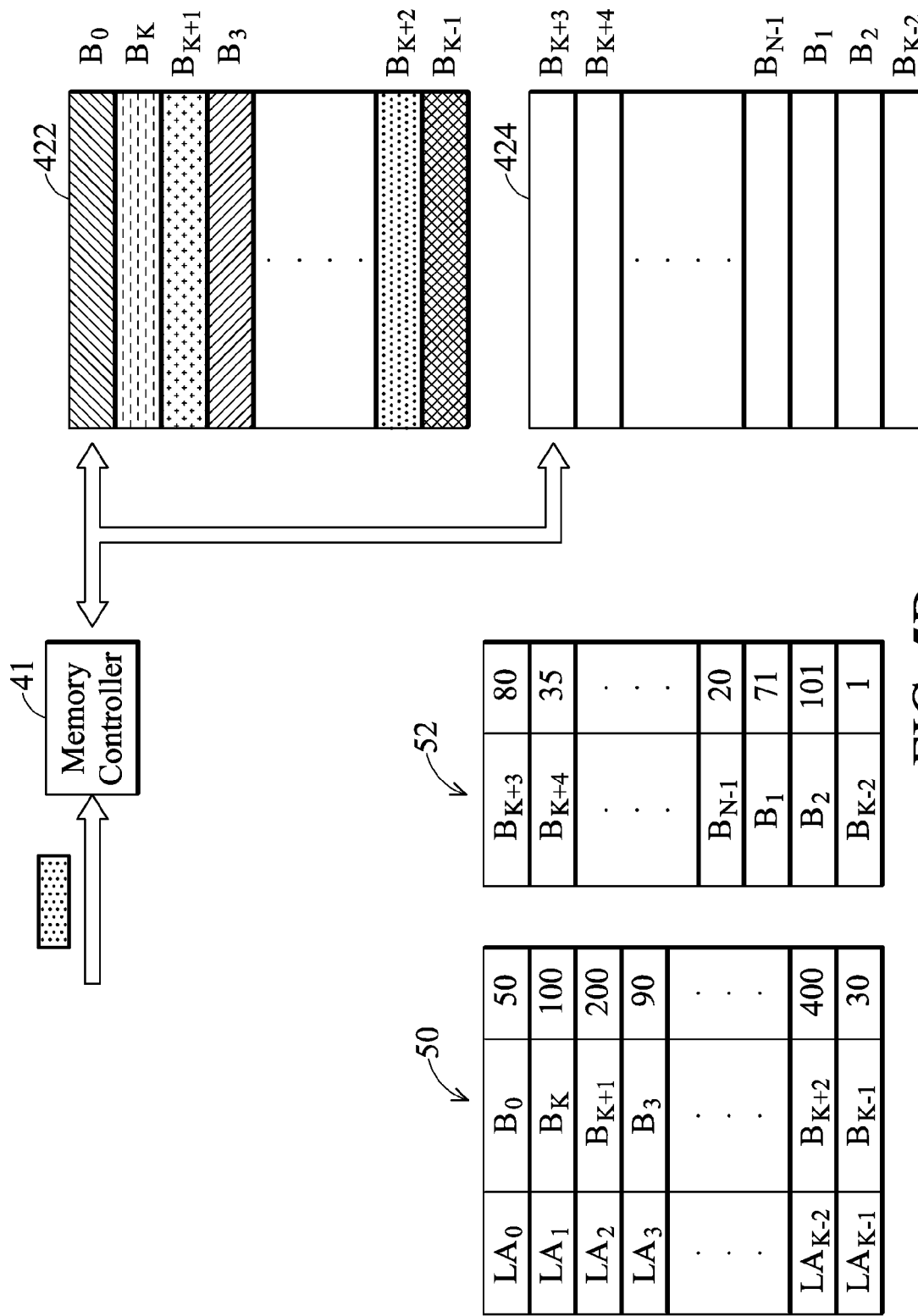

The memory controller 41 then pops the spare block $B_{K+2}$ at the top of the queue of the spare region 424 and determines whether the erase count of the spare block $B_{K+2}$ reaches 400 (i.e. the default value). Because the erase count of the spare block $B_{K+2}$ reaches 400, the memory controller 41 searches whether there is a data block with an erase count of zero in the data region 422. Because the data block $B_{K-2}$ has an erase count of zero, the memory controller 41 selects (pops) the data block $B_{K-2}$ in the data region 422, and re-maps the data block $B_{K-2}$ and the spare block $B_{K+2}$. Namely, the memory controller 41 retrieves the data stored in the data block $B_{K-2}$ and writes the retrieved data into the spare block $B_{K+2}$. Further, the memory controller 41 links the logical address $LA_{K-2}$ to the physical address of the spare block $B_{K+2}$, erases the data block $B_{K-2}$ and pushes the erased data block $B_{K-2}$ into the bottom of the queue as a part of the spare region 424. As shown in FIG. 5D, the block $B_{K+2}$ is recorded in the data region 422 and is linked to the logical address $LA_{K-2}$, and the block $B_{K-2}$ is recorded in the spare region 424. It should be noted that the erase count of the block $B_{K-2}$ is 1 and is recorded in the spare block mapping table 52.

Figure 5E:
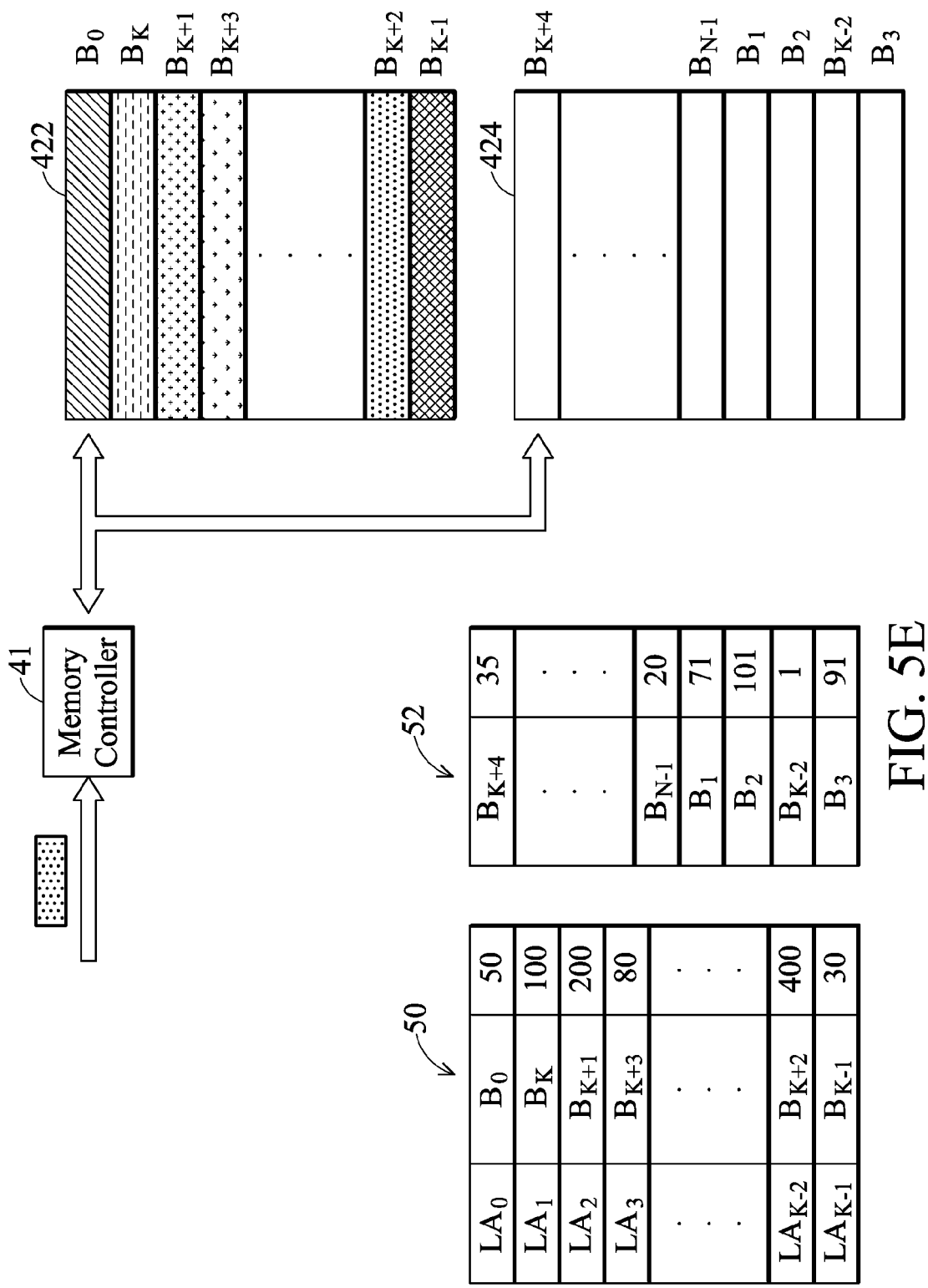

After the data block $B_{K-2}$ and the spare block $B_{K+2}$ are re-mapped, the memory controller 41 pops a spare block from the spare region 424 for writing/storing data. At this time, the memory controller 41 pops the spare block $B_{K+3}$ at the top of the queue of the spare region 424 and determines whether the erase count of the spare block $B_{K+3}$ reaches 400. Because the erase count of the spare block $B_{K+3}$ is 80 which is less than 400, the memory controller 41 re-maps the data block $B_3$ and the spare block $B_{K+3}$. Namely, the memory controller 41 writes the data corresponding to the data block $B_3$ from the host into the spare block $B_{K+3}$ and links the logical address $LA_3$ to the physical address of the spare block $B_{K+3}$, erases the data block $B_3$ and pushes the erased data block $B_3$ into the bottom of the queue as a part of the spare region 424. As shown in FIG. 5E, the block $B_{K+3}$ is recorded in the data region 422, and the block $B_3$ is recorded in the spare region 424. It should be noted that the erase count of the block $B_3$ is 91 and is recorded in the spare block mapping table 52.

Figure 6A:
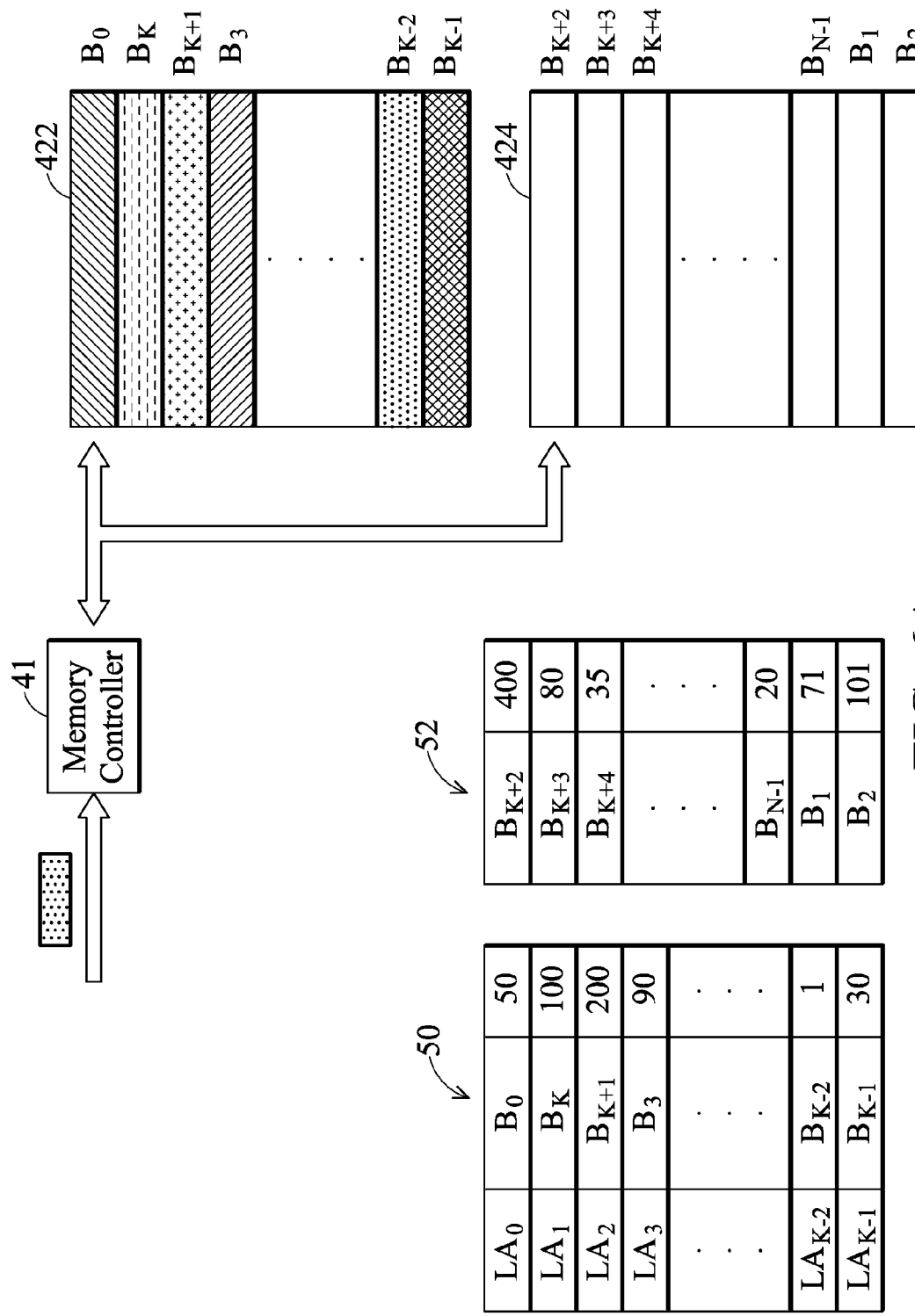
FIGS. 6A~6C are access diagrams of the flash memory of the invention for illustrating an embodiment where there is no data block with an erase count of zero.
Figure 6B:
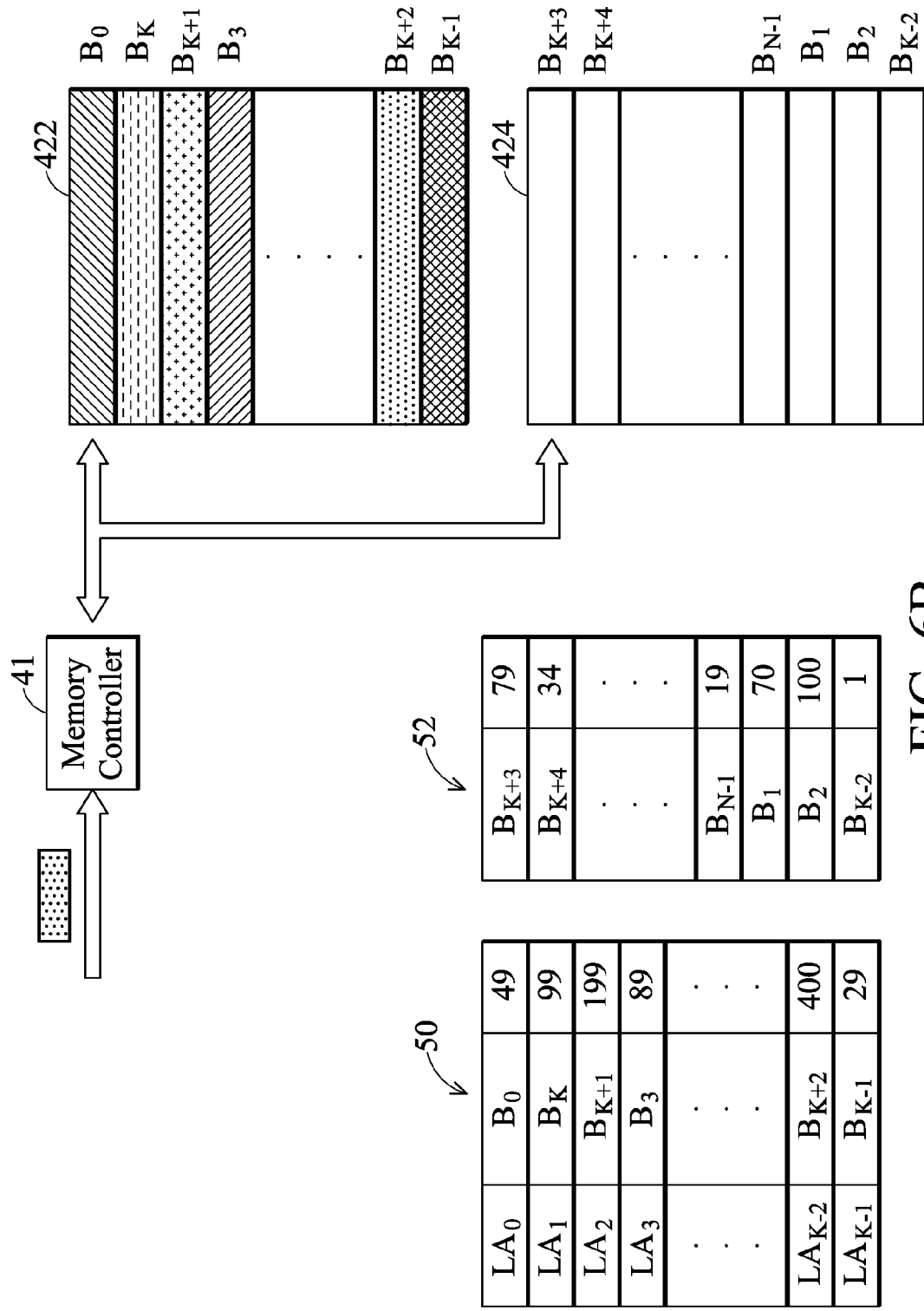
Figure 6C:
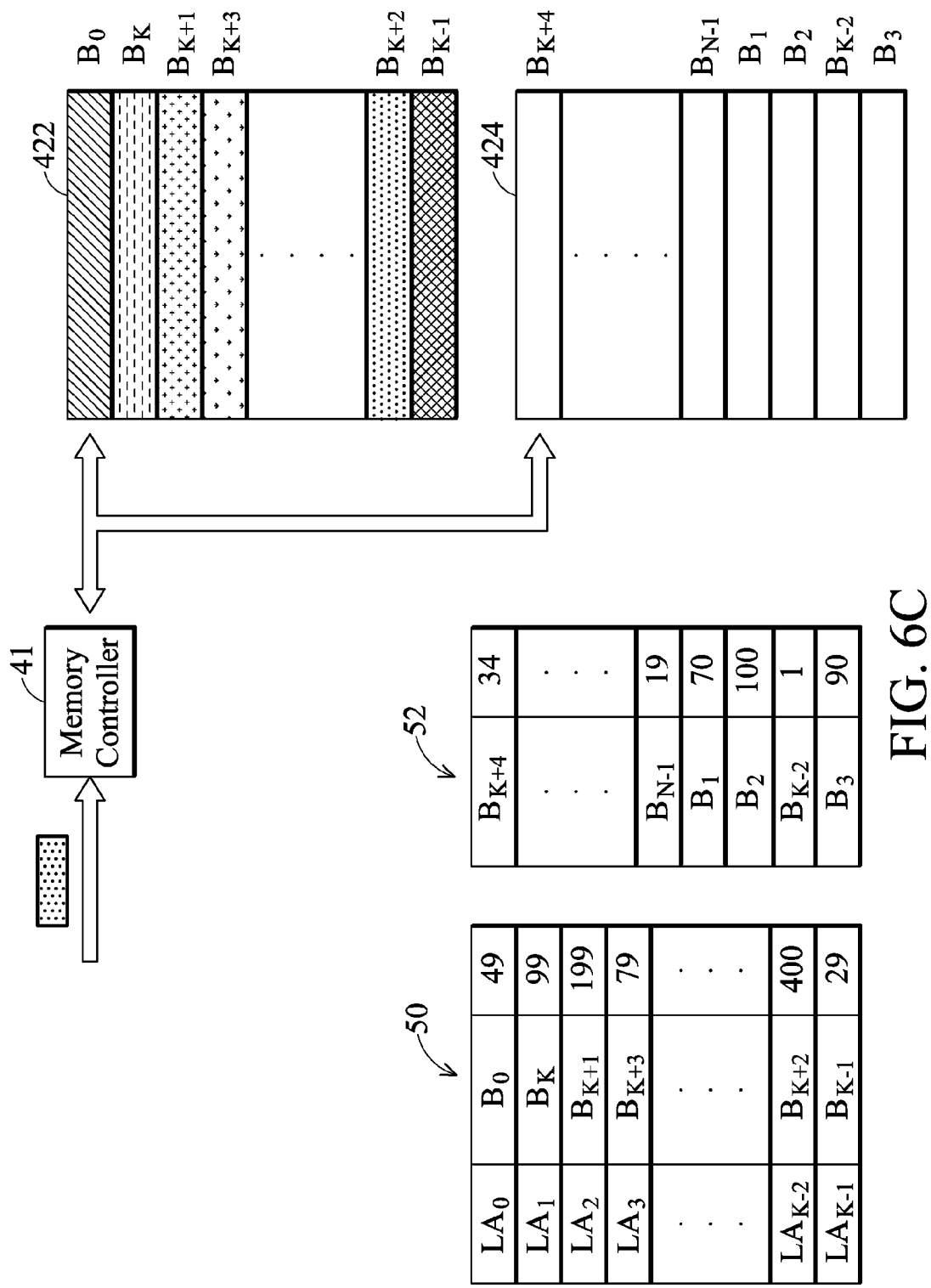

FIGS. 6A~6C are access diagrams of the flash memory of the invention for illustrating an embodiment where there is no data block with an erase count of zero. As shown in FIG. 6A, each data block in the data region 422 stores data, and each spare block in the spare region 424 is empty (i.e. stores no data). The logical address $LA_0$ is linked to the data block $B_0$ with an erase count of 50, the logical address $LA_1$ is linked to the data block $B_K$ with an erase count of 100, the logical address $LA_2$ is linked to the data block $B_{K+1}$ with an erase count of 200, and so on. The spare region mapping table 52 shows that the erase count of the spare block $B_{K+2}$ is 400, the erase count of the spare block $B_{K+3}$ is 80, the erase count of the spare block $B_{K+4}$ is 35, and so on.

After receiving the write command, the memory controller 41 receives data corresponding to the data block $B_3$ linked to the logical address $LA_3$ from the host, and temporarily stores the received data into the buffer 412. Afterwards, the memory controller 41 pops the spare block $B_{K+2}$ at the top of the queue of the spare region 424 and determines whether the erase count of the spare block $B_{K+2}$ reaches the default value (i.e., 400). Because the erase count of the spare block $B_{K+2}$ is 400, the memory controller 41 searches whether there is a data block with an erase count of zero in the data region 422. The memory controller 41 then decreases the erase counts of the all blocks (i.e. the data blocks and the spare blocks) in the data region 422 and the spare region 424 by one because there is no data block with an erase count of zero.

The memory controller 41 selects/pops the data block $B_{K-2}$ from the data region 422 and re-maps the data block $B_{K-2}$ and the spare block $B_{K+2}$, because the erase count of the data block $B_{K-2}$ becomes zero from one after been decreased by one. Namely, the memory controller 41 retrieves the data stored in the data block $B_{K-2}$, stores the retrieved data into the spare block $B_{K+2}$, and links the logical address $LA_{K-2}$ to the physical address of the spare block $B_{K+2}$. Further, the memory controller 41 erases the data block $B_{K-2}$ and pushes the erased data block $B_{K-2}$ into the bottom of the queue as a part of the spare region 424. As shown in FIG. 6B, the block $B_{K+2}$ is recorded in the data region 422 and is linked to the logical address $LA_{K-2}$, and the block $B_{K-2}$ is recorded in the spare region 424. It should be noted that the erase count of the block $B_{K-2}$ is 1 and is recorded in the spare block mapping table 52.

After the data block $B_{K-2}$ and the spare block $B_{K+2}$ are re-mapped, the memory controller 41 pops a spare block from the spare region 424 for writing/storing data. At this time, the memory controller 41 pops the spare block $B_{K+3}$ at the top of the queue of the spare region 424 and determines whether the erase count of the spare block $B_{K+3}$ reaches 400. Because the erase count of the spare block $B_{K+3}$ is 79 and is less than 400, the memory controller 41 re-maps the data block $B_3$ and the spare block $B_{K+3}$. Namely, the memory controller 41 writes the data corresponding to the data block $B_3$ from the host into the spare block $B_{K+3}$ and links the logical address $LA_3$ to the physical address of the spare block $B_{K+3}$, erases the data block $B_3$ and pushes the erased data block $B_3$ into the bottom of the queue as a part of the spare region 424. As shown in FIG. 6C, the block $B_{K+3}$ is recorded in the data region 422, and the block $B_3$ is recorded in the spare region 424. It should be noted that the erase count of the block $B_3$ is 90 and is recorded in the spare block mapping table 52.

Figure 7A:
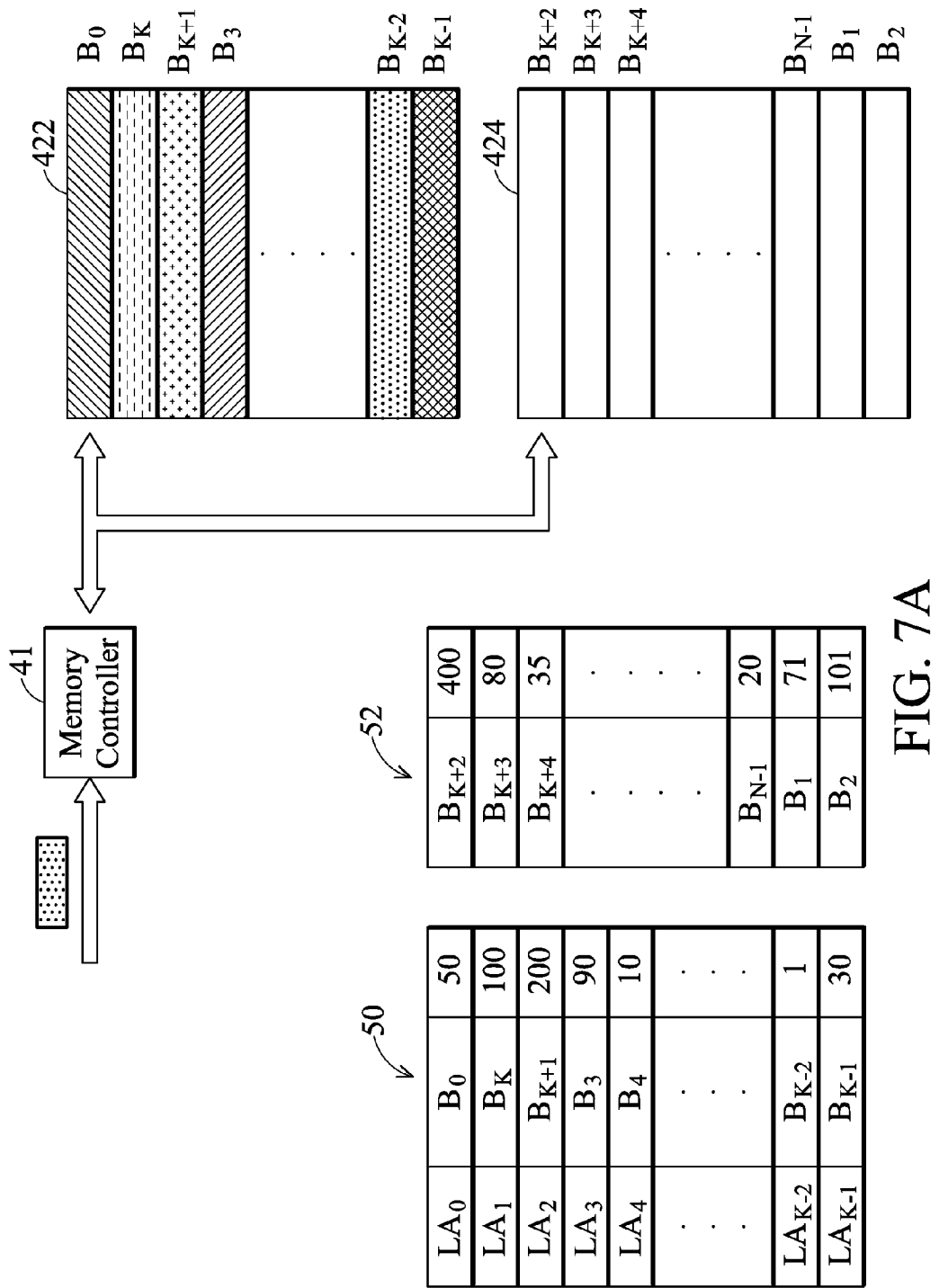
FIGS. 7A~7E are access diagrams of the flash memory of the invention for illustrating another embodiment where there is no data block with an erase count of zero.

FIGS. 7A~7E are access diagrams of the flash memory of the invention for illustrating another embodiment where there is no data block with an erase count of zero. As shown in FIG. 7A, each data block in the data region 422 stores data, and each spare block in the spare region 424 is empty (i.e. stores no data). The logical address $LA_0$ is linked to the data block $B_0$ with an erase count of 50, the logical address $LA_1$ is linked to the data block $B_K$ with an erase count of 100, the logical address $LA_2$ is linked to the data block $B_{K+1}$ with an erase count of 200, and so on. The spare region mapping table 52 shows that the erase count of the spare block $B_{K+2}$ is 400, that of the spare block $B_{K+3}$ is 80, that of the spare block $B_{K+4}$ is 35, and so on.

Figure 7B:
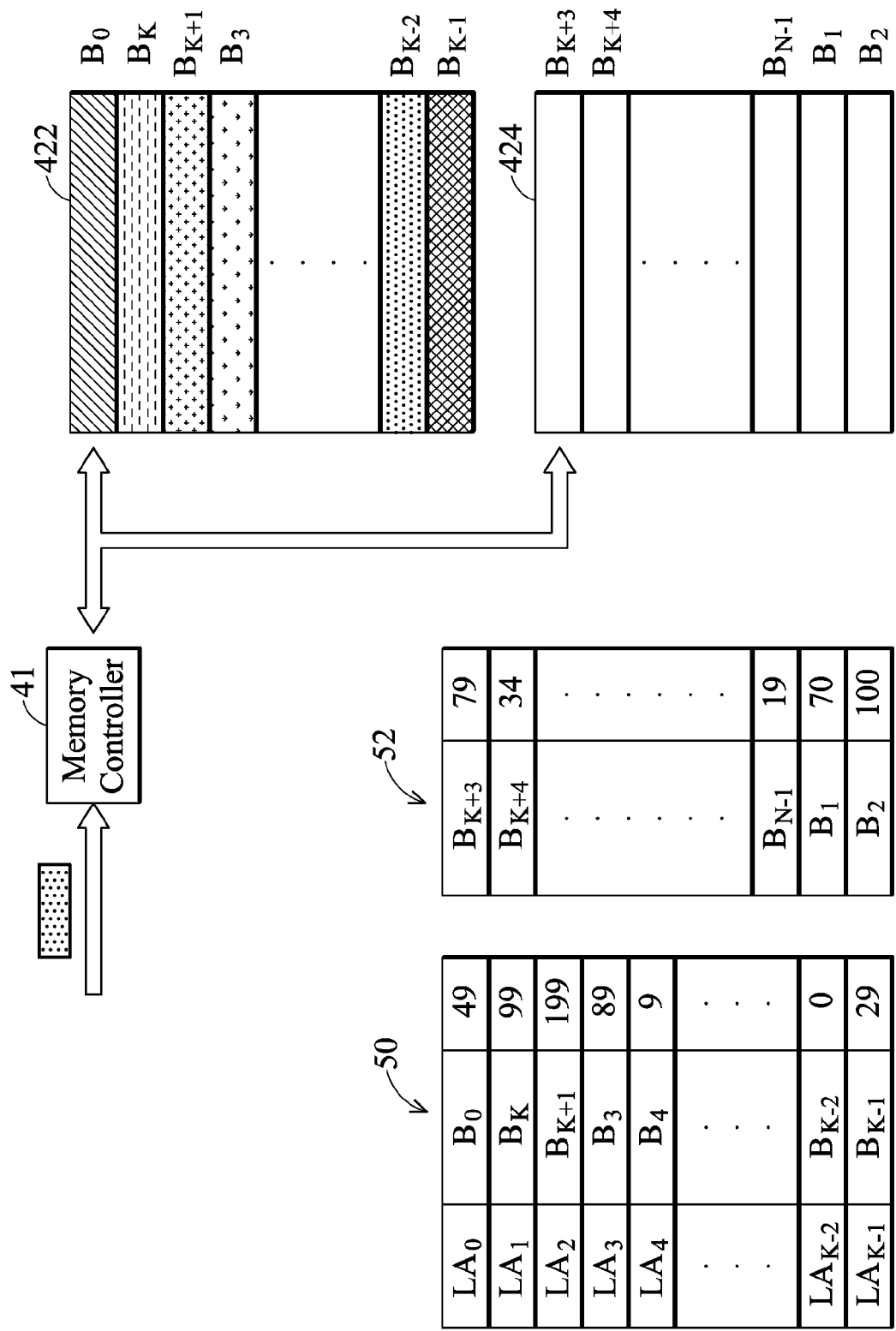

After receiving the write command, the memory controller 41 receives data corresponding to the data block $B_3$ linked to the logical address $LA_3$ from the host, and temporarily stores the received data into the buffer 412. Afterwards, the memory controller 41 pops the spare block $B_{K+2}$ at the top of the queue of the spare region 424 and determines whether the erase count of the spare block $B_{K+2}$ reaches the default value (i.e., 400). Because the erase count of the spare block $B_{K+2}$ reaches 400, the memory controller 41 searches whether there is a data block with an erase count of zero in the data region 422. The memory controller 41 temporarily stores the physical address of the spare block $B_{K+2}$ into the buffer 412 and decreases the erase counts of the all blocks (i.e. the data blocks and the spare blocks) in the data region 422 and the spare region 424 by one, because there is no data block with an erase count of zero. As shown in FIG. 7B, the erase count of the data block $B_0$ becomes 49 from 50, the erase count of the data block $B_K$ becomes 99 from 100, the erase count of the data block $B_{K+1}$ becomes 199 form 200, and so on.

Figure 7C:
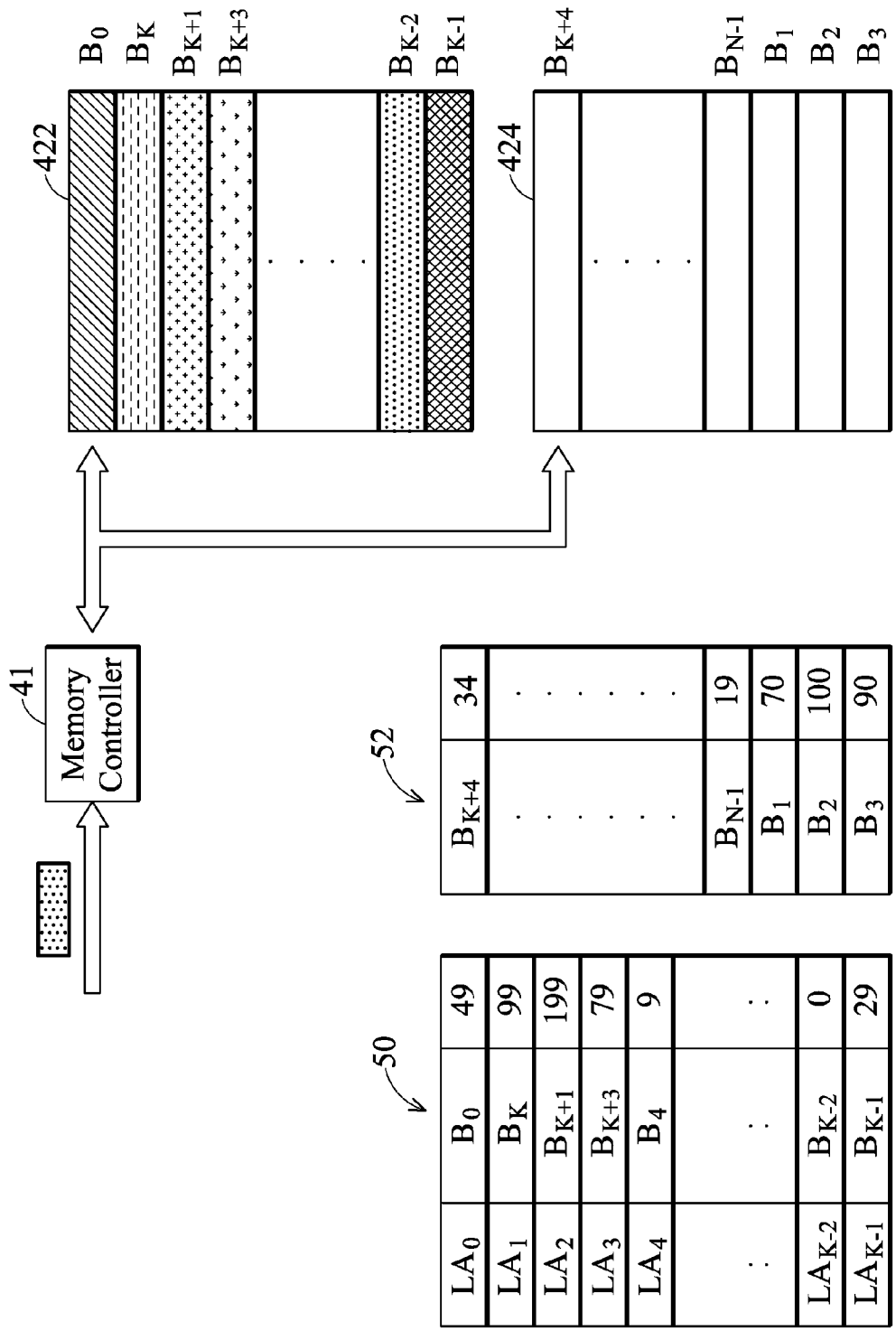

Subsequently, the memory controller 41 pops the spare block $B_{K-3}$ at the top of the queue of the spare region 424 and determines whether the erase count of the spare block $B_{K+3}$ reaches 400. Because the erase count of the spare block $B_{K+3}$ is 79 and is less than 400, the memory controller 41 re-maps the data block $B_3$ and the spare block $B_{K+3}$. Namely, the memory controller 41 writes the data corresponding to the data block $B_3$ from the host into the spare block $B_{K+3}$ and links the logical address $LA_3$ to the physical address of the spare block $B_{K+3}$, erases the data block $B_3$ and pushes the erased data block $B_3$ into the bottom of the queue as a part of the spare region 424. As shown in FIG. 7C, the block $B_{K+3}$ is recorded in the data region 422, and the block $B_3$ is recorded in the spare region 424. It should be noted that the erase count of the block $B_3$ is 90 and is recorded in the spare block mapping table 52.

Figure 7D:
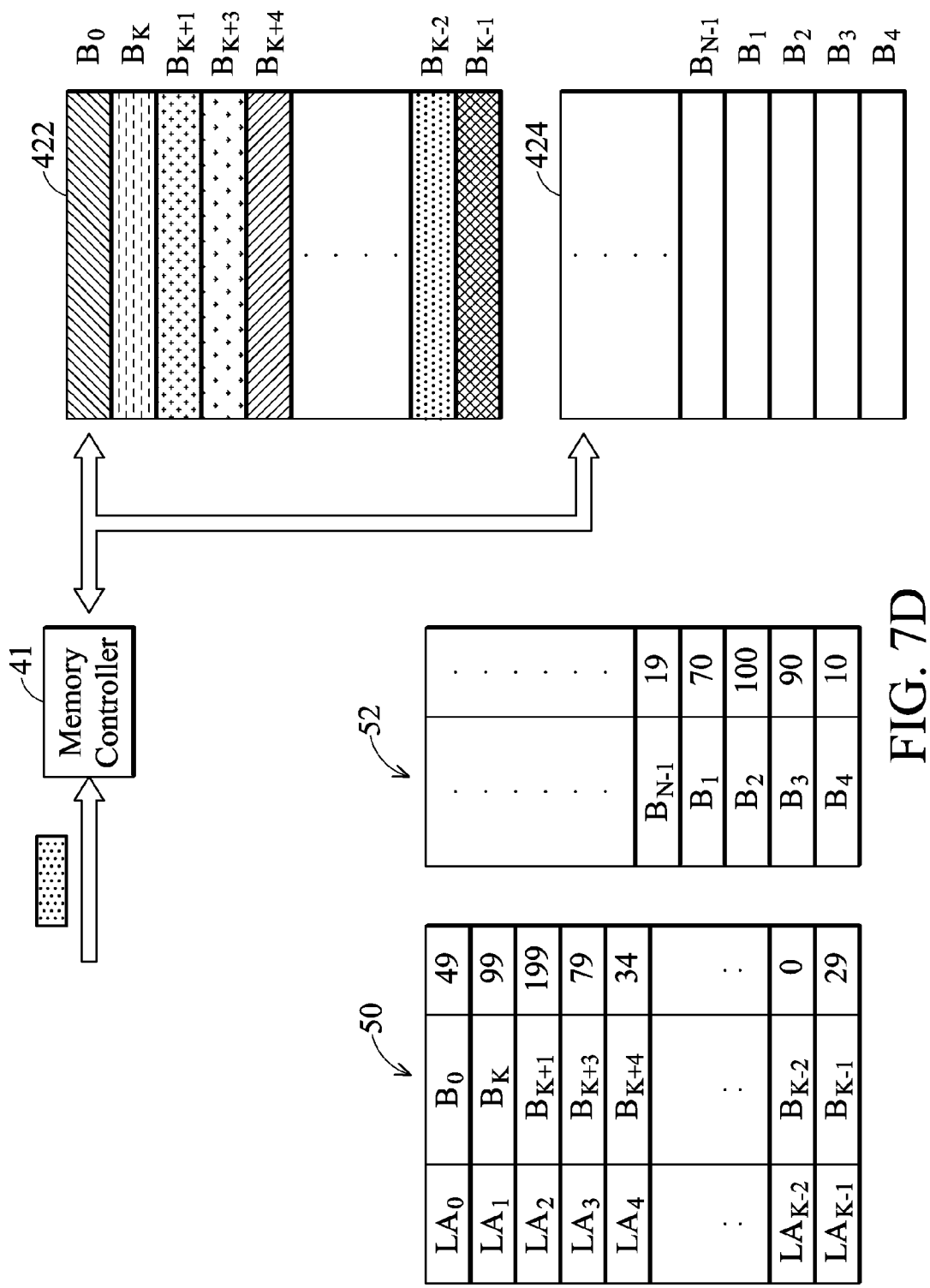

If data corresponding to the data block $B_4$ linked to the logical address $LA_4$ from the host is then received, the memory controller 41 temporarily stores the received data into the buffer 412. Afterwards, the memory controller 41 pops the spare block $B_{K+4}$ at the top of the queue of the spare region 424 and determines whether the erase count of the spare block $B_{K+4}$ reaches 400. Because the erase count of the spare block $B_{K+4}$ is 34 which is less than 400, the memory controller 41 re-maps the data block $B_4$ and the spare block $B_{K+4}$. Namely, the memory controller 41 writes the data corresponding to the data block $B_4$ from the host into the spare block $B_{K+4}$ and links the logical address $LA_4$ to the physical address of the spare block $B_{K+4}$, erases the data block $B_4$ and pushes the erased data block $B_4$ into the bottom of the queue as a part of the spare region 424. As shown in FIG. 7D, the block $B_{K+4}$ is recorded in the data region 422, and the block $B_4$ is recorded in the spare region 424. It should be noted that the erase count of the block $B_4$ is 10 and is recorded in the spare block mapping table 52.

Figure 7E:
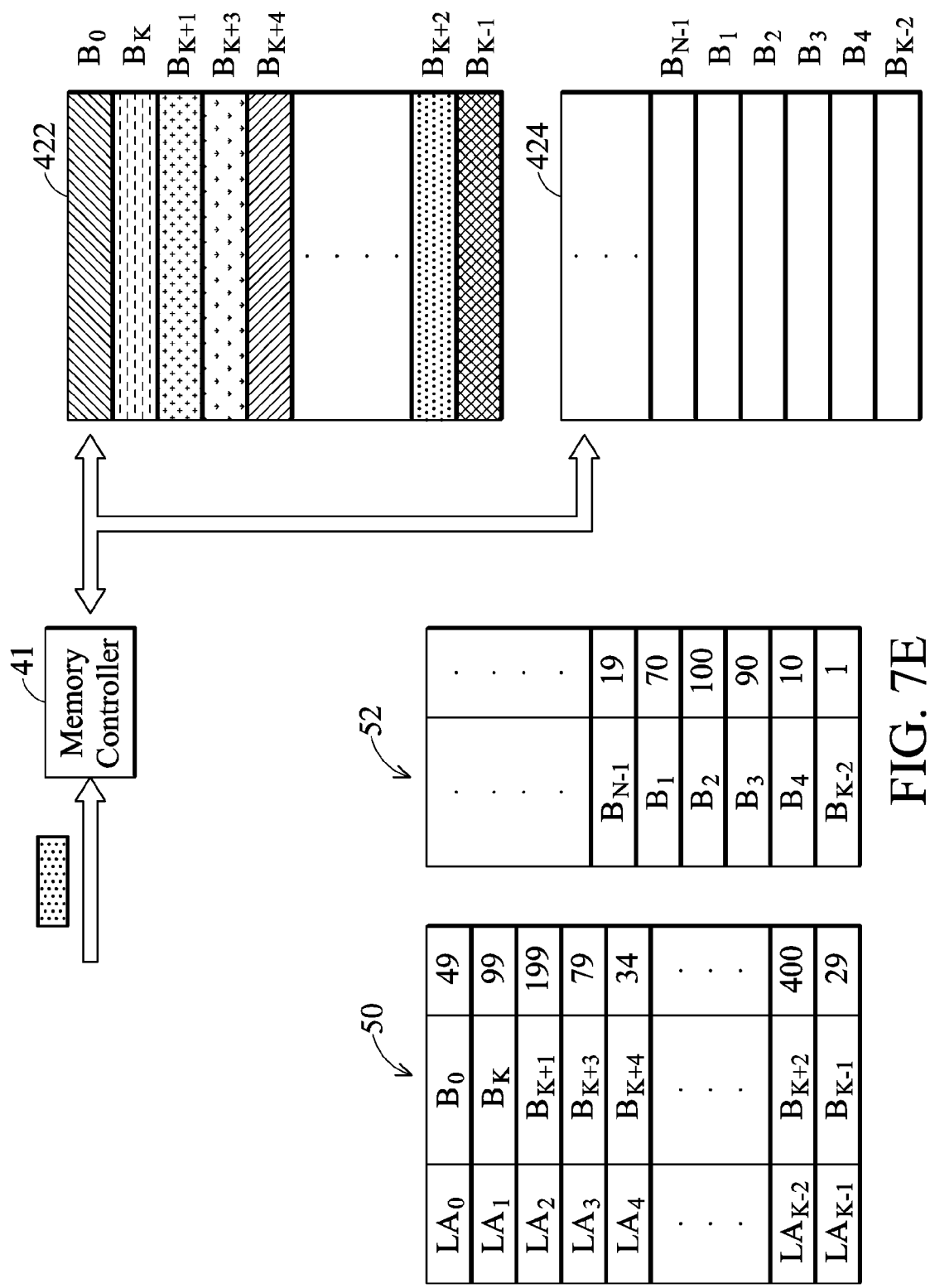

The memory controller 41 selects/pops the data block $B_{K-2}$ from the data region 422 and re-maps the data block $B_{K-2}$ and the spare block $B_{K+2}$, because the erase count of the data block $B_{K-2}$ becomes zero from 1 after been decreased by one. Namely, the memory controller 41 retrieves the data stored in the data block $B_{K-2}$, stores the retrieved data into the spare block $B_{K+2}$, and links the logical address $LA_{K-2}$ to the physical address of the spare block $B_{K+2}$. Further, the memory controller 41 erases the data block $B_{K-2}$ and pushes the erased data block $B_{K-2}$ into the bottom of the queue as a part of the spare region 424. As shown in FIG. 7E, the block $B_{K+2}$ is recorded in the data region 422 and is linked to the logical address $LA_{K-2}$, and the block $B_{K-2}$ is recorded in the spare region 424. It should be noted that the erase count of the block $B_{K-2}$ is 1 and is recorded in the spare block mapping table 52.

Although the invention has been described in terms of preferred embodiment, it is not limited thereto. Those skilled in the art can make various alterations and modifications without departing from the scope and spirit of the invention. Therefore, the scope of the invention shall be defined and protected by the following claims and their equivalents.

What is claimed is:

1. An access method for a flash memory, wherein the flash memory comprises a data region and a spare region, the data region comprises a plurality of data blocks and the spare region comprises a plurality of spare blocks, comprising:
    retrieving a corresponding data with a check code from a first data block of the flash memory according to a read command from a host;
    performing a predetermined check to the corresponding data by the check code;
    determining whether an error is correctable when a check result of the predetermined check represents that the error has occurred; and
    increasing an erase count of the first data block by a predetermined value when the error is correctable, wherein the predetermined value exceeds two.

2. The method as claimed in claim 1, further comprising marking the first data block as a failed block when the error is uncorrectable.

3. The method as claimed in claim 1, wherein the check code is an error correction code (ECC).

4. The method as claimed in claim 1, further comprising:
    receiving data corresponding to a logical address linked to a second data block of the data region when receiving a write command from the host;
    popping a spare block from the spare region; and
    writing the data into the popped spare block and linking a physical address of the popped spare block to the logic address.

5. The method as claimed in claim 4, further comprising performing data integration to the data blocks of the data region before popping the spare block.

6. The method as claimed in claim 4, further comprising:
    erasing the second data block; and
    pushing the second data block into the spare region.

7. An access method for a flash memory, wherein the flash memory is divided into a data region with a plurality of data blocks and a spare region with a plurality of spare blocks, comprising:
    retrieving a corresponding data with a check code from a first data block of the flash memory according to a read command from a host;
    performing a predetermined check to the corresponding data by the check code;
    determining whether an error is correctable when a check result of the predetermined check represents that the error has occurred;
    increasing an erase count of the first data block by a predetermined value when the error is correctable;
    receiving data corresponding to a logical address linked to a second data block of the data region when receiving a write command from the host;
    popping a first spare block from the spare region; and
    writing data stored in a third data block to the first spare block and re-mapping the third data block and the first spare block when an erase count of the first spare block reaches a default value and the data region has the third data block with an erase count of zero.

8. The method as claimed in claim 7, further comprising decreasing the erase count of the all data blocks in the data region and the all spare blocks in the spare region by one, when the erase count of the first spare block reaches the default value and the data region does not have the third data block with the erase count of zero.

9. The method as claimed in claim 8, further comprising:
    popping a second spare block from the spare region; and
    writing the data corresponding to the logical address into the second spare block and linking a physical address of the second spare block to the logic address, when the erase count of the second spare block is less than the default value.

10. A memory device, comprising:
    a flash memory comprising a data region with a plurality of data blocks and a spare region with a plurality of spare blocks; and a controller retrieving a corresponding data with a check code from a first data block of the flash memory according to a read command from a host, performing a predetermined check to the corresponding data by the check code, determining whether an error is correctable when a check result of the predetermined check represents that the error has occurred, and increasing an erase count of the first data block by a predetermined value when the error is correctable, wherein the predetermined value exceeds two.

11. The memory device as claimed in claim 10, wherein the controller marks the first data block as a failed block when the error is uncorrectable.

12. The memory device as claimed in claim 10, wherein the check code is an error correction code (ECC).

13. The memory device as claimed in claim 10, wherein the controller receives data corresponding to a logical address linked to a second data block when receiving a write command from the host, and the controller pops a spare block from the spare region, and writes the data into the popped spare block and links a physical address of the popped spare block to the logical address when the erase count of the popped spare block is less than a default value.

14. The memory device as claimed in claim 13, wherein the controller further performs a data integration to the data blocks of the data region before popping the spare block.

15. The memory device as claimed in claim 13, wherein the controller erases the second data block and pushes the erased second data block into the spare region when the erase count of the popped spare block is less than the default value.

16. The memory device as claimed in claim 13, wherein, when an erase count of the popped spare block reaches the default value and the data region has a third data block with an erase count of zero, the controller writes data stored in the third data block to the popped spare block and re-maps the third data block and the popped spare block.

17. The memory device as claimed in claim 16, wherein, when the erase count of the first spare block reaches the default value and the data region does not have the third data block with the erase count of zero, the controller decreases the erase count of the all data blocks in the data region and the all spare blocks in the spare region by one.

18. The memory device as claimed in claim 16, wherein the controller further erases the third data block and pushes the erased third data block into the spare region, when the erase count of the popped spare block reaches the default value and the data region has the third data block with the erase count of zero.

* * * * *